United States Patent
Cachier et al.

(10) Patent No.: US 6,454,171 B1
(45) Date of Patent: Sep. 24, 2002

(54) ELECTRONIC CARD ENCAPSULATING AT LEAST ONE IC CHIP AND THE METHOD FOR PRODUCING THE SAME

(75) Inventors: Gérard Cachier, Bures sur Yvette; Jean-Yves Daden, Bois Colombes; Alain Grancher, Vemars; Ludovic Michel, Plaisir, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/508,690

(22) PCT Filed: Sep. 22, 1998

(86) PCT No.: PCT/FR98/02035
§ 371 (c)(1),
(2), (4) Date: Mar. 29, 2000

(87) PCT Pub. No.: WO99/17367
PCT Pub. Date: Apr. 8, 1999

(30) Foreign Application Priority Data

Sep. 30, 1997 (FR) .............................. 97 12131

(51) Int. Cl.[7] .............................................. G06K 19/00
(52) U.S. Cl. ........................................ 235/487; 235/492
(58) Field of Search ................................ 235/375, 492, 235/380; 361/395, 400

(56) References Cited

U.S. PATENT DOCUMENTS

| | | |
|---|---|---|
| 4,028,556 A | 6/1977 | Cachier et al. |
| 4,054,875 A | 10/1977 | Cachier |
| 4,126,932 A | 11/1978 | Cachier |
| 4,152,718 A | 5/1979 | Cachier |
| 4,197,546 A | 4/1980 | Cachier et al. |
| 4,278,951 A | 7/1981 | Cachier et al. |
| 4,280,110 A | 7/1981 | Cachier et al. |
| 4,306,312 A | 12/1981 | Cachier |
| 4,333,076 A | 6/1982 | Cachier |
| 4,682,119 A | 7/1987 | Michel |
| 4,876,239 A | 10/1989 | Cachier |
| 5,027,190 A | * 6/1991 | Haghiri-Tehrani et al. .... 357/74 |
| 5,055,913 A | * 10/1991 | Haghiri-Tehrani et al. .... 375/74 |
| 5,079,673 A | * 1/1992 | Kodai et al. ................. 361/400 |
| 5,173,840 A | * 12/1992 | Kodai et al. ................. 361/395 |
| 5,175,597 A | 12/1992 | Cachier et al. |
| 5,208,450 A | * 5/1993 | Uenishi ....................... 235/492 |
| 5,262,796 A | 11/1993 | Cachier |
| 5,270,814 A | 12/1993 | Michel |
| 5,313,693 A | 5/1994 | Cachier |
| 5,357,213 A | 10/1994 | Michel et al. |
| 5,361,039 A | 11/1994 | Michel |
| 5,438,020 A | 8/1995 | Grancher et al. |
| 5,543,765 A | 8/1996 | Cachier |
| 5,753,901 A | * 5/1998 | Bitschnau et al. .......... 235/492 |
| 5,852,289 A | * 12/1998 | Masahiko ................... 235/492 |
| 5,965,867 A | * 10/1999 | Haghiri-Tehrani et al. .. 235/492 |

\* cited by examiner

Primary Examiner—Karl D. Frech
Assistant Examiner—Ahshik Kim
(74) Attorney, Agent, or Firm—Oblon, Spivak, McClelland, Maier & Neustadt, P.C.

(57) ABSTRACT

A mechanical protection of a chip by an encapsulation product poured onto the chip and then cured. The problem is one of depositing only a small thickness of encapsulation product above the chip and above its wire bonds so as not to disturb the operation of the chip. In order to control this thickness, the chip is mounted on a tab, the height of which is chosen so that the difference in height between the top of the chip and the top of the surrounding printed circuits is equal to the desired thickness of the encapsulation. The encapsulation product is then poured onto the chip until it reaches the upper level of the printed circuits, without exceeding it. Such a mechanical protection may find particular application to electronic chips operating at microwave frequencies.

7 Claims, 7 Drawing Sheets

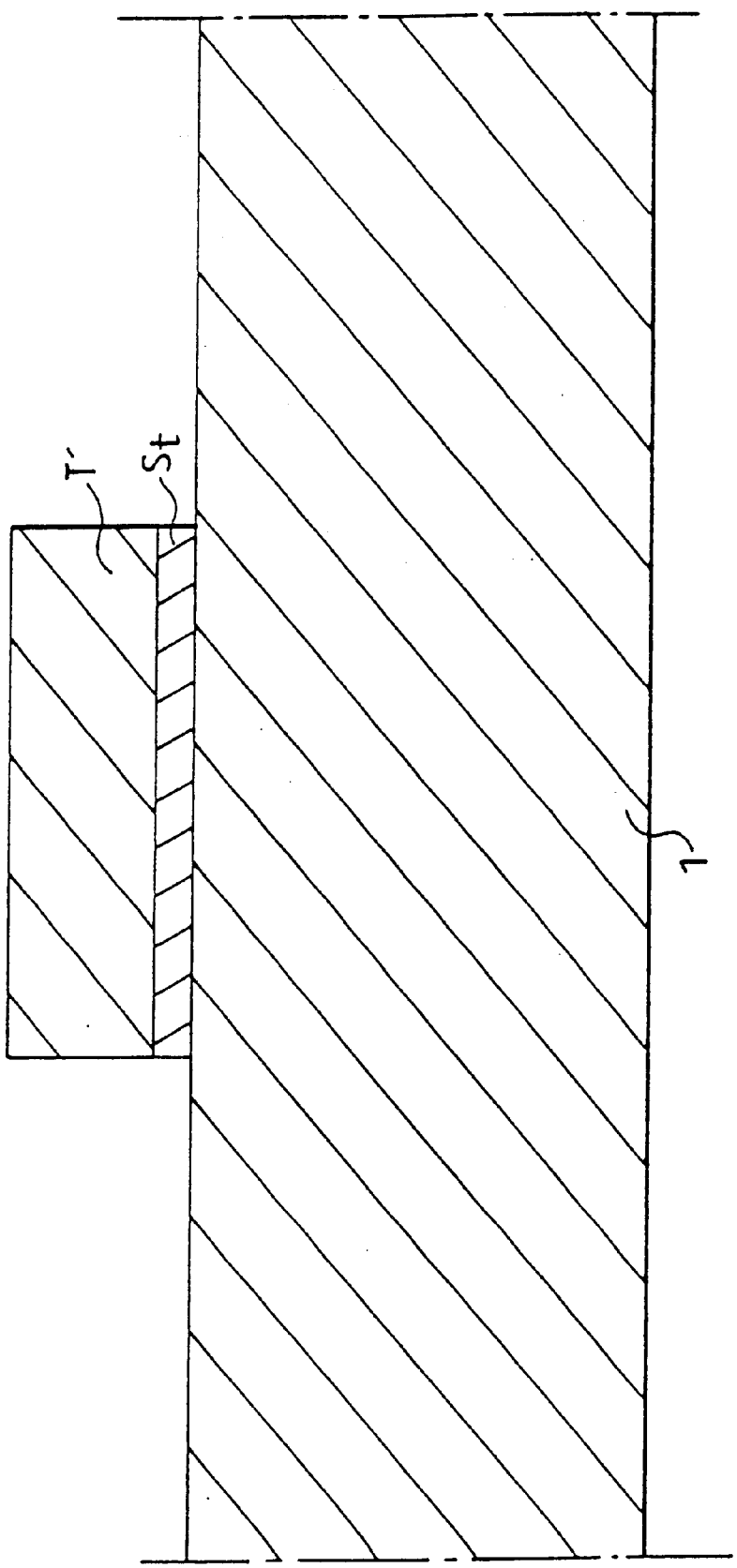

Figure 1:
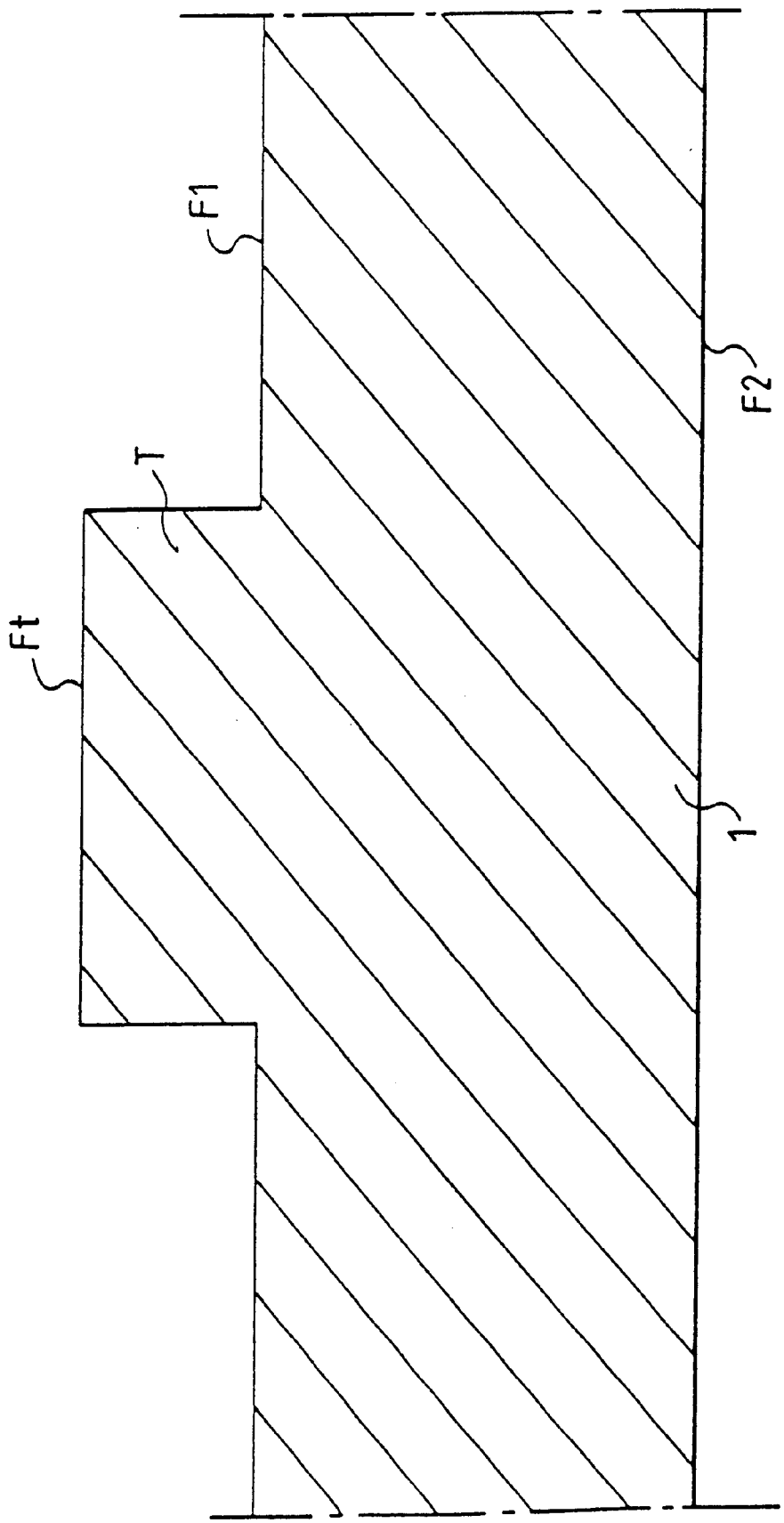

ELECTRONIC CARD ENCAPSULATING AT LEAST ONE IC CHIP AND THE METHOD FOR PRODUCING THE SAME

BACKGROUND OF THE INVENTION

1. Field of the Invention

The present invention relates to the protection of electronic chips, particularly in the case of their use at microwave frequencies.

2. Discussion of the Background

It is known to produce electronic cards comprising a support or base, a connection plug and at least one chip with its connection circuits. The support is a plane plate, generally made of brass, on which the chip and a printed-circuit part which includes the connection circuits for the chip are placed; this printed-circuit part is connected to the chip by wire bonds.

In order to mechanically protect a chip mounted in this way in an electronic card, it is known to encapsulate it in a product such as a resin. To do this, resin is deposited on the chip and its wire bonds to the connection circuits; after the resin has cured, it forms a kind of shell which effectively protects the chip and its wire bonds.

However, these chips are designed to operate with radiofrequency propagation in a heterogeneous medium which is, for example, air and GaAs; now, the resin transforms this medium into an air/resin/GaAs medium and as a result the propagation, and therefore the electrical behaviour of the chip, are modified. This modification is all the less acceptable the higher the operating frequencies and, in practice, the encapsulation process indicated above allows operation only at frequencies of less than 10 GHz.

SUMMARY OF THE INVENTION

The object of the present invention is to propose an encapsulation process which allows operation possibly up to 50 GHz.

This is achieved by controlling the amount of resin deposited so as to reduce the thickness of the latter to a thin layer and therefore to reduce, consequently, the perturbating effects.

According to the invention, what is proposed is a process for encapsulating an electronic chip in the case in which, on the one hand, this chip is placed on a mechanical support having a plane face and in which, on the other hand, part of a printed circuit having a thickness greater than the thickness of the chip is also placed on the support and. at least partially surrounds the chip, characterized in that it consists in providing a tab in the support, which projects from the plane surface, in raising the chip by placing it on this tab, in choosing a tab thickness such that, with respect to the plane face, the height of the top of the printed-circuit part is greater than the height of the top of the chip and that the difference between these two heights is less than a predetermined value, in filling the space between the printed-circuit part and the chip with an encapsulation product as far as the upper level of the printed-circuit part and in curing the encapsulation product.

According to the invention, what is also proposed is an electronic card which includes at least one electronic chip, characterized in that the chip is protected by encapsulation carried out according to an encapsulation process described in the above paragraph.

BRIEF DESCRIPTION OF HE DRAWINGS

Figure 2A:
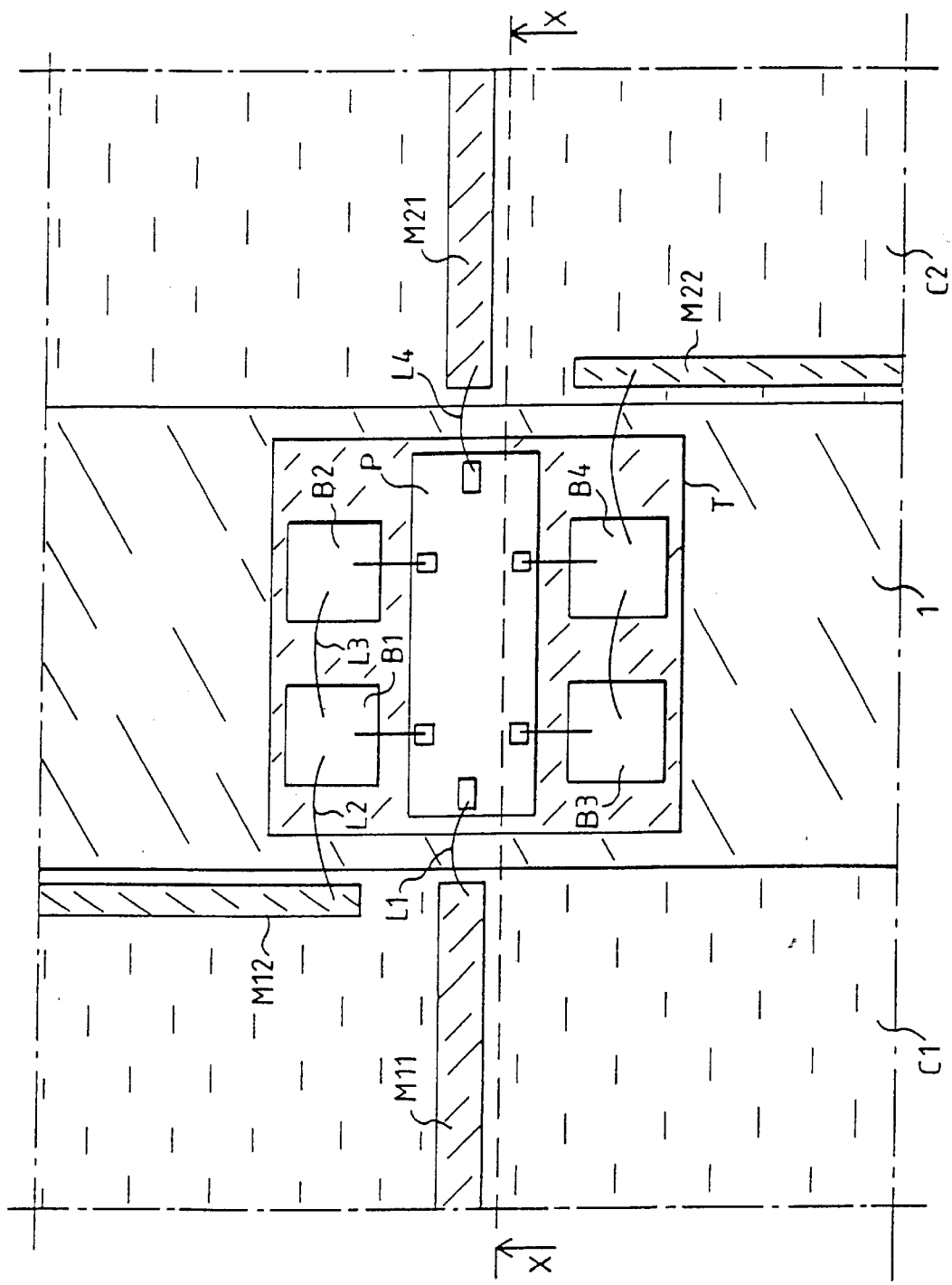
Figure 2B:
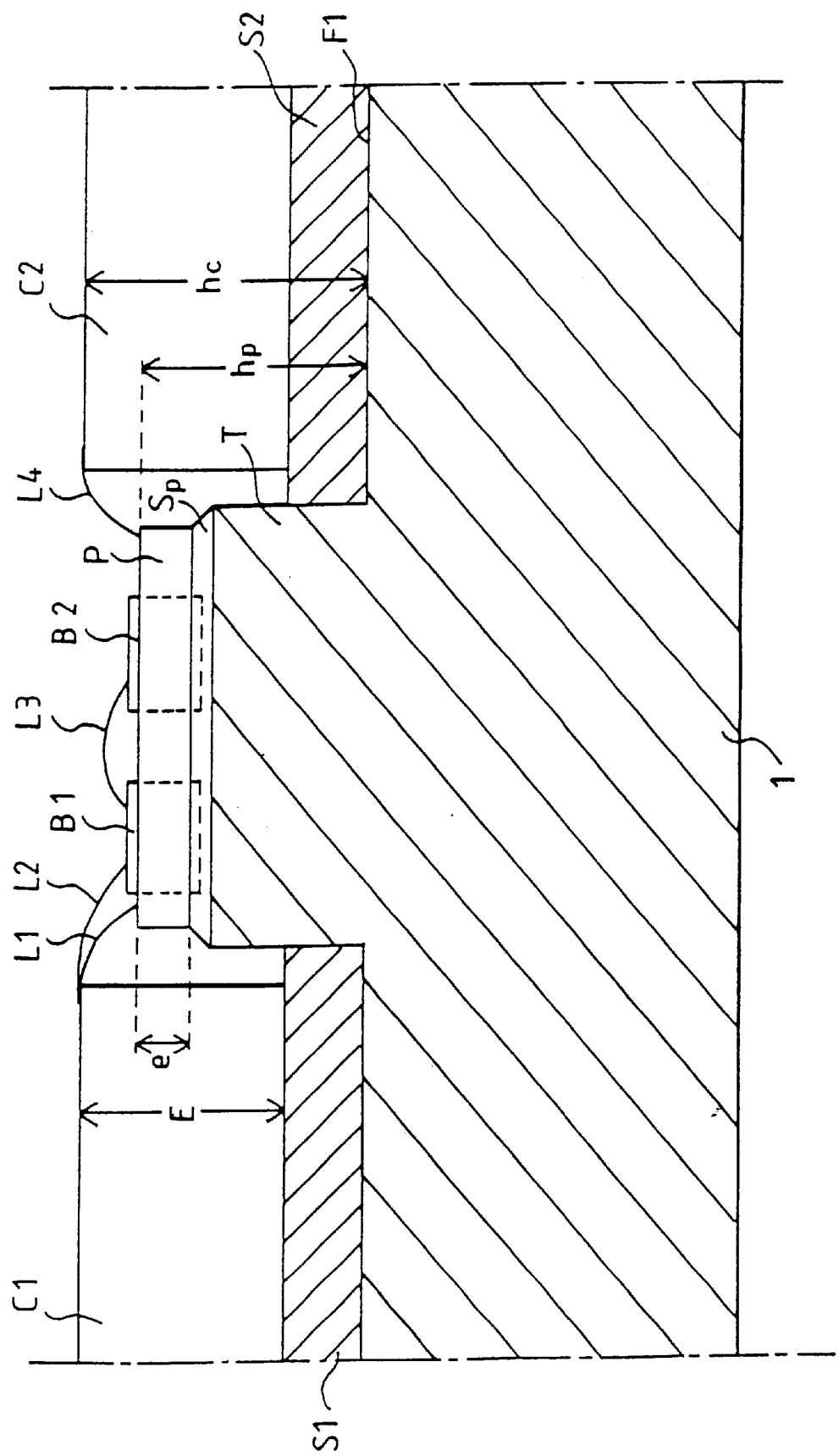
Figure 3A:
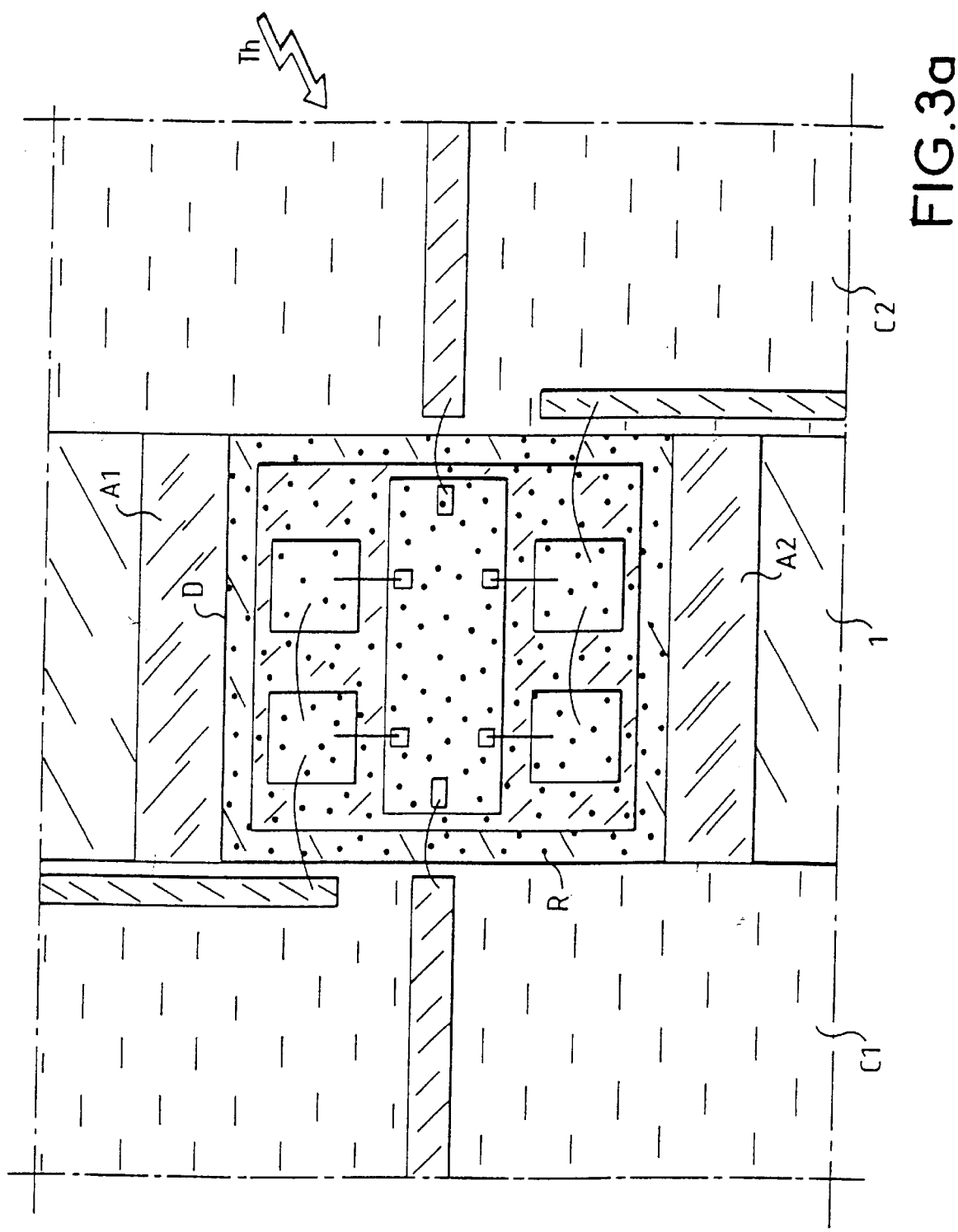
Figure 3B:
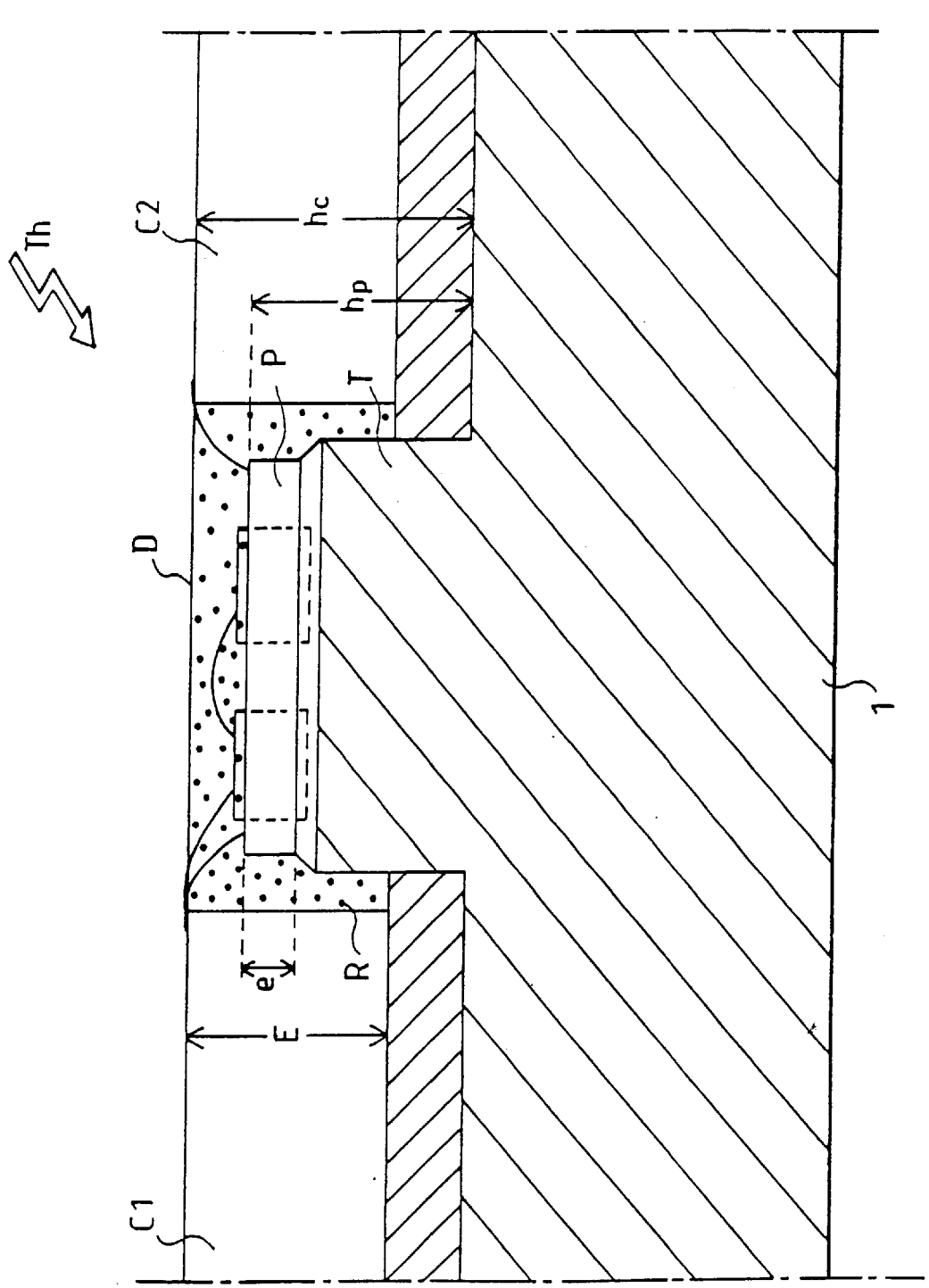
Figure 5:
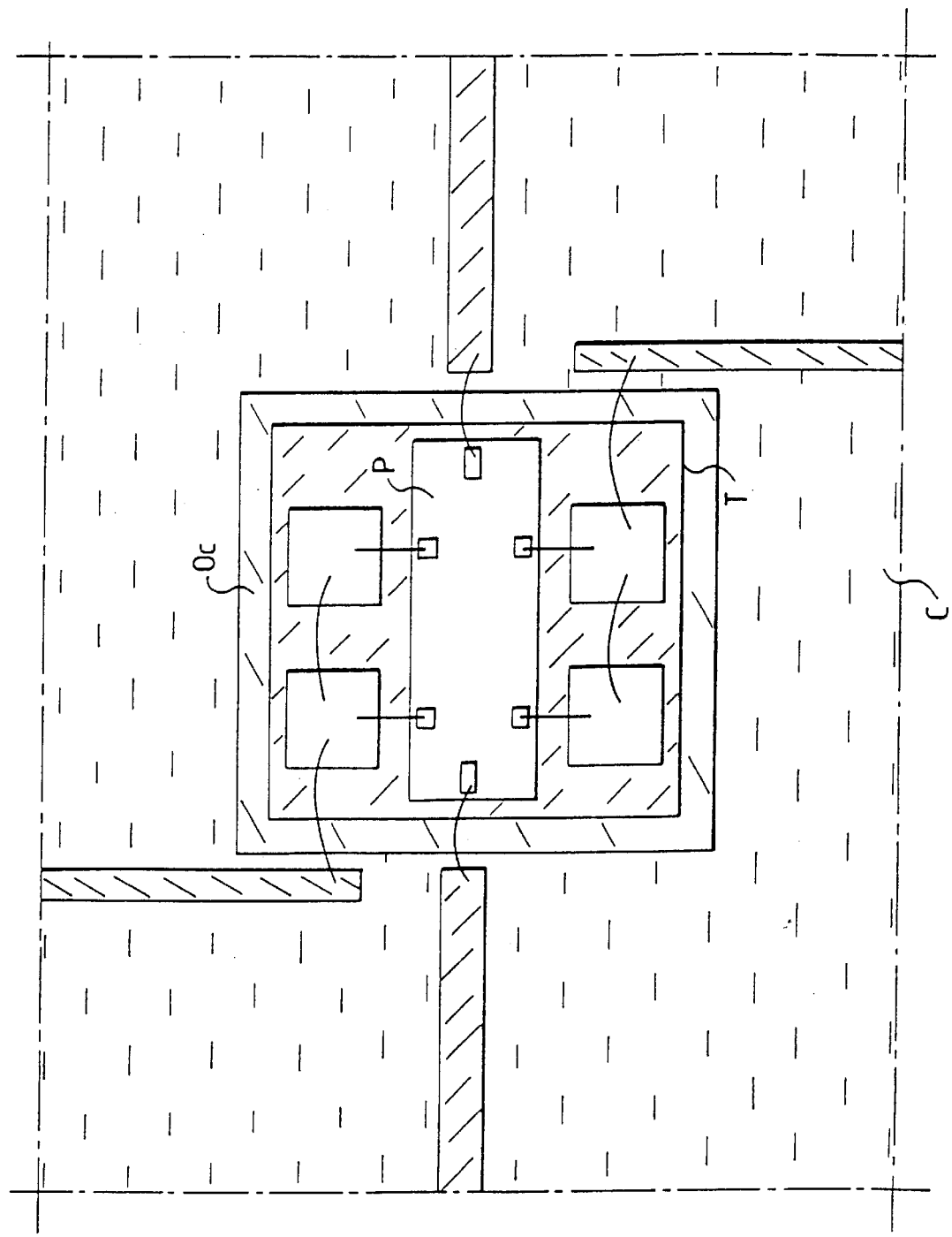

The present invention will be more clearly understood and further characteristics will appear with the aid of the description below and of the figures relating thereto, which represent:

FIG. 1, a partial sectional view of an electronic card element used in one method of implementing the process according to the invention;

FIGS. 2a, 2b, partial top views, in cross section, of an electronic card whose design constitutes one step of the process according to the invention;

FIGS. 3a, 3b, views corresponding to those in FIGS. 2a, 2b, but during the actual encapsulation phase, as proposed in the process according to the invention;

FIG. 4, a variant, in the context of the invention, to the embodiment of the element according to FIG. 1, FIG. 5, a variant, in the context of the invention, to the embodiment of the electronic card in FIGS. 2a, 2b.

DESCRIPTION OF THE PREFERRED EMBODIMENTS

FIG. 1 shows, in a partial limited view between two axis lines, a brass plate 1 having two parallel plane faces F1, F2. One of these faces, F1, has a tab T which forms a parallelogram whose upper face Ft is a rectangle parallel to the faces F1, F2. The plate is intended to form the mechanical support, also called a base, for an electronic card on which an electronic chip is mounted. The tab is provided for implementing the encapsulation process, which is described in this document, and its function will appear below; the conventional bases do not include tabs.

FIG. 2a shows, in a partial top view, the base 1 in FIG. 1, but as it is after components have been placed, by soldering, on that one of its faces, F1, which has the tab T; FIG. 2a is therefore a partial view of an electronic card. The components visible in FIG. 2a consist of two printed circuits C1, C2, of a chip P with its decoupling elements B1 to B4 and of conductors, such as L1 to L4, which make connections between the components.

The decoupling elements B1 to B4 form low-pass filters connected to the supply terminals of the chip. These decoupling elements and the chip are mounted on the upper face of the tab T by soldering and the dimensions of this upper face correspond to the area just necessary for easy mounting of the chip and of its four decoupling elements.

The printed circuits C1, C2 bear, on their upper face, that is to say on their face on the opposite side from the face F1 of the base 1, connection circuits made of conducting strips: M11, M12 in the case of the printed circuit C1 and M21, M22 in the case of the printed circuit C2; as regards their lower face, this consists entirely of a copper earth plane. These two printed circuits are placed on either side and in the immediate vicinity of the tab T.

FIG. 2b is a sectional view corresponding to the partial view of the electronic card according to FIG. 2a; the plane of section is a plane perpendicular to the plane of FIG. 2a and the line of this plane of section in FIG. 2a has been identified by a broken straight line XX; it is a similar plane of section which is used for the sections in the FIGS. 1, 3b and 4. This sectional view shows, apart from the base 1, the chip P, the coupling elements B1, B2, the conductors L1 to L4 and the soldered joints S1, S2, Sp between the base 1 and, respectively, the printed circuits C1, C2 and the assembly consisting of the chip P and its decoupling elements.

The following have been denoted in this figure:

the height hc, above the face F1 of the base 1 of the upper faces of the printed circuits C1, C2;

the height hp, above the face F1 of the base 1, of the upper face of the chip 1;

the thickness E of the printed circuits and the thickness e of the chip.

It should be noted in FIG. 2b that, by virtue of the tab T, the value hc is slightly greater than the value hp and that the difference, hc−hp, is appreciably less than a predetermined value which will be explained below.

In a conventional arrangement in which the chip is soldered to a base without the tab, the resin is not poured onto the chip taking as end-of-filling reference the upper edge of a printed circuit and cannot be metered accurately; in order to be certain that the encapsulation has been carried out correctly, it is necessary for the resin layer above the chip to be relatively thick, particularly in order to cover the bonding conductors; this results, as was mentioned above, in a modification to the radiofrequency propagation such that the operating frequencies, in order to avoid perturbations, must always be chosen below 10 GHz.

In contrast, in an embodiment like that in FIGS. 2a, 2b, it is possible to control the resin thickness above the chip 1; to do this, it is merely a question of suitably choosing the value of hc—hp, that is to say in fact the height of the tab T; the resin, in the fluid state, can then be poured onto the chip using as reference for the upper level the upper edge of the printed circuits.

FIGS. 3a and 3b illustrate such a filling operation. These figures repeat FIGS. 2a and 2b with, in addition, the resin R, shown by black dots. Under this resin, the concealed constituents, such as the chip, have been shown as if the resin and the chip were transparent.

The space in which the chip P lies is limited laterally only on two sides, by virtue of the printed circuits C1, C2. It is therefore necessary, before filling with the resin in -the liquid state, to close the other two sides. This is achieved using a tool provided with tongs having two jaws A1, A2, which tool is guided along the edges of the board 1 and of the printed circuits C1, C2 in order to position its jaws; since the construction of such a tool or of another tool or indeed of a mounting capable of fulfilling the same function lies within the scope of those skilled in the art of mechanics, in order to simplify the explanation and therefore to make it clearer only the two jaws have been shown, in the position they occupy during filling and during curing of the resin. The jaws A1 and A2 are mutually parallel plates having a length barely less than the distance between the two printed circuits and having a height equal to the thickness E of the printed circuits. The upper edge of the jaw A1 is identified by the letter D in FIGS. 3a and 3b.

By adjusting the resin level in this way, it is possible for the thickness for the layer deposited on an electronic chip to be accurately predetermined depending on the operating frequencies to be achieved; thus, in the embodiments which have served as examples in the present description, it has been possible to limit the reduction in transmission due to the encapsulation to less than 0.7 decibels at a frequency of 40 GHz; for this, it appears that the predetermined value of hc—hp not to be exceeded is 100 micrometres.

Correct implementation of the process that has just been described requires machining the base and controlling the solder thicknesses and resin thicknesses such that the tolerances on the dimensions are compatible with the predetermined value not to be exceeded. It also requires choosing an encapsulation product—resin or other material—which contracts only very slightly when it solidifies.

This solidification conventionally takes place at high temperature in an oven and is followed by removal of the tool fitted with the jaws A1, A2; this is depicted in FIGS. 3a, 3b by an arrow marked Th. In order to compensate, if necessary, for a slight contraction of the resin on passing through the oven, it is possible, by taking advantage of the viscosity of the resin before curing, to meter the supply of resin so that, without extending beyond the printed circuits and the jaws, there is a slightly convex surface.

The supply of resin may be metered in various ways and, in particular: by line of sight;—by a calibrated drop deposited on the chip by means of a syringe for example;—by application using a brush; using a calibrated stencil with a flexible bag which contains the resin and leaves it to be deposited by pressure;—by a centrifuge: rapid rotation of the electronic card allows the resin to be kept only on the chip;—or indeed by using, instead of the tool with jaws shown in FIGS. 3a, 3b, a tool with jaws+cover so as to form a closed space provided with two orifices, one for injecting the resin the other for acting as a vent, that is to say for allowing the excess resin injected to escape. In the embodiments that have served as an example in the present description, the first and then the second ways were used.

The invention is not limited to the description above; thus, in particular, instead of forming an integral part of the base, the tab may be a metal piece attached to the plate by soldering or with the aid of a conducting adhesive; FIG. 4 illustrates such a base with a plate 1, a piece T', fastened by a soldered joint St, being on one of the faces of this plate.

Another possible way of implementing the process involves a design of electronic cards in which the printed-circuit part completely surrounds the chip to be encapsulated. This may be accomplished using four printed circuits side by side in order to leave on the plate only the area needed for connection to the chip. This may also be accomplished, as illustrated in FIG. 5, by means of a single printed circuit C, pierced by a hole Oc, the position and dimensions of which are determined according to the connection to the chip P.

It should be noted that the alternative methods of implementing the process which were mentioned in the previous paragraph make it easier for the chip to be encapsulated; on the other hand, for cards already studied, they go beyond a simple modification of the base and of a possible replacement of two printed circuits, which is intended to bring these circuits closer to the chip; these alternative methods are therefore difficult if they are not provided right from the design of the electronic card.

What is claimed is:

1. A process for encapsulating an electronic chip in a case, comprising:

provisioning a tab in a mechanical support, the tab projecting from a plane face of the mechanical support;

placing a chip on the mechanical support;

placing part of a printed-circuit having a thickness greater than a thickness of the chip on the mechanical support, said printed-circuit at least partially surrounding the chip;

choosing a tab thickness such that, with respect to the plane face, a height of a top of the printed-circuit part is greater than a height of a top of the chip, a difference between these two heights being less than a predetermined value;

filling a space between the printed-circuit part and the chip with an encapsulation product up to an upper level of the printed-circuit part; and curing the encapsulation product.

2. The process according to claim 1, further comprising:

completing the surrounding of the chip by temporary walls; and removing the temporary walls after the encapsulation product has been cured.

3. The process according to claim 1, wherein the printed-circuit part completely surrounds the chip.

4. The process according to claim 3, wherein the printed-circuit part includes a printed-circuit pierced by a hole, and edges of the printed-circuit surround the chip.

5. The process according to claim 1, wherein the tab forms an integral part of the mechanical support.

6. The process according to claim 1, wherein the tab is a metal piece attached to the mechanical support.

7. An electronic card which includes at least one electronic chip, wherein the chip is protected by an encapsulation produced according to an encapsulation process described in claim 1.

* * * * *